United States Patent [19]

Sichanugrist et al.

[11] Patent Number: 4,790,883
[45] Date of Patent: Dec. 13, 1988

[54] LOW LIGHT LEVEL SOLAR CELL

[76] Inventors: Porponth Sichanugrist, 1890 W. Hillcrest #428, Newbury Park, Calif. 91320; Karl E. Knapp, 7745 Chimineas Ave., Reseda, Calif. 91335

[21] Appl. No.: 134,737

[22] Filed: Dec. 18, 1987

[51] Int. Cl.⁴ .................... H01L 31/06; H01L 31/18
[52] U.S. Cl. .................... 136/258; 136/256; 357/30; 427/39; 437/4
[58] Field of Search .......... 136/258 AM, 256; 357/30 J, 30 K, 30 Q; 437/4; 427/39

[56] References Cited

U.S. PATENT DOCUMENTS

| | | | |
|---|---|---|---|
| 4,385,200 | 5/1983 | Hamakawa et al. | 136/258 |
| 4,388,482 | 6/1983 | Hamakawa et al. | 136/258 |
| 4,410,559 | 10/1983 | Hamakawa et al. | 427/39 |
| 4,492,736 | 1/1985 | Tanner | 428/446 |

FOREIGN PATENT DOCUMENTS

| | | | |
|---|---|---|---|
| 59-63774 | 4/1984 | Japan | 136/258 |
| 61-220378 | 9/1986 | Japan | 136/258 |

OTHER PUBLICATIONS

P. H. Fang et al., *Appl. Phys. Lett.*, vol. 41, pp. 365–366, (1982).

*Primary Examiner*—Aaron Weisstuch
*Attorney, Agent, or Firm*—Albert C. Metrailer

[57] ABSTRACT

A photovoltaic cell of the thin film silicon p-i-n class in which a microcrystalline silicon film is used in place of the p or n region of the p-i-n structure and is simultaneously used as the corresponding current collecting film.

7 Claims, 1 Drawing Sheet

LOW LIGHT LEVEL SOLAR CELL

BACKGROUND OF THE INVENTION

The present invention relates to the field of thin film silicon photovoltaic devices and more particularly to the use of a microcrystalline silicon film as a current collecting film in such devices.

The art of thin film solar cells is well known and improvements are being made therein in an effort to make such devices commercially practical. For example, amorphous silicon p-i-n structures are disclosed in U.S. Pat. Nos. 4,385,200 and 4,388,482 issued to Hamakawa on May 24, 1983 and June 14, 1983, respectively. Another Hamakawa et al patent, U.S. Pat. No. 4,410,559 issued Oct. 18, 1983 provides a more detailed teaching concerning the glow discharge techniques for depositing amorphous silicon films with various doping materials. Each of these patents is hereby incorporated by reference by the teachings of cell structures and methods of manufacture.

While the basic amorphous silicon p-i-n photovoltaic device seems quite simple, continued research and development efforts have identified numerous problems which degrade the performance thereof. For example, U.S. Pat. No. 4,492,736 issued to Tanner on Jan. 8, 1985, discusses the problem of contact between a current collecting film and a p-i-n thin film silicon photovoltaic device. This patent is incorporated by reference for all purposes. In particular, this patent notes that it is difficult to make a good low resistance contact between amorphous silicon and the typical back-face contact which is made of aluminum. The Tanner patent teaches the use of an n-type microcrystalline silicon film in place of the n-type amorphous silicon region normally found in thin film silicon p-i-n photovoltaic devices. The microcrystalline form of silicon forms a much better contact with the aluminum current collecting film and thereby improves device performance.

Another problem commonly encountered in the manufacture of thin film silicon devices is the occurrence of "pinholes." Pinholes are small spots or holes in the silicon film which leave the front current collecting film exposed. Therefore, when the back-face current collecting film is deposited, it makes a direct contact with the front face film and forms a shunt or short circuit. Various techniques have been developed for eliminating or fixing such shunts. The typical device structure uses a tin oxide front face contact and an aluminum back-face contact. This structure can be somewhat self fixing because oxygen from the tin oxide tends to form an insulating layer of aluminum oxide at the contact point. This reaction generally forms sufficient insulation to limit the resulting shunt current to an acceptable level in high power devices, that is devices intended for use in direct sun light. However, this type of shunt is unacceptable in devices for low light level, for example indoor, applications such as "solar" powered calculators. For such low light level use, less than 200 lux, essentially no shunting can be tolerated.

Therefore, it is seen that it would be desirable to provide a photovoltaic device structure which eliminates or is not sensitive to pinholes and a method of manufacture which eliminates or is not affected by pinholes which occur in the thin silicon film.

SUMMARY OF THE INVENTION

A photovoltaic device according to the present invention comprises a thin film silicon p-i-n structure and means for collecting current from the front and back faces of the structure wherein at least one of the p or n-type regions of the silicon includes or is formed of a relatively thick layer of microcrystalline silicon, appropriately doped, and said microcrystalline region also functions as the current collecting film. The process of the present invention comprises deposition of a microcrystalline silicon film, appropriately doped, as at least part of the p or n region of a p-i-n thin film silicon photovoltaic device in the same equipment as the remaining thin film silicon regions are deposited whereby pinhole shunting is avoided.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
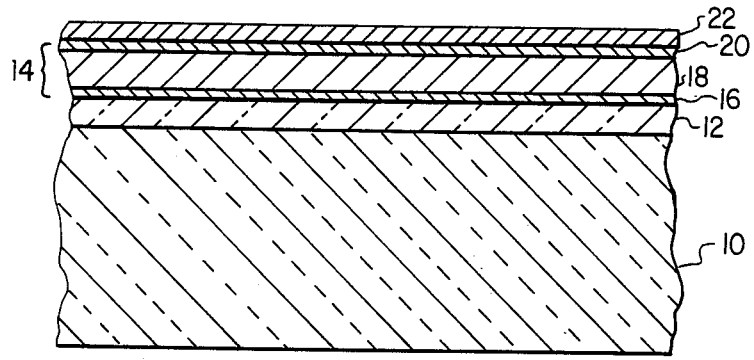
FIG. 1 is a cross-sectional illustration, not to scale, of a first photovoltaic device structure according to the present invention.

With reference now to FIG. 1 there will be described a first embodiment of the present invention. The photovoltaic device of FIG. 1 is manufactured on a glass substrate 10. Deposited on glass substrate 10 is a device which may be made according to the teachings of the above-referenced Hamakawa patents. In particular, there is formed a first, or front-face, current collecting film 12 of a transparent conductive material such as tin oxide. Deposited upon conductor 12 is a thin amorphous silicon film 14 having a p-doped region 16, an intrinsic region 18 and an n-doped region 20. The device is completed by a second, or back-face, current collecting film 22. In prior art devices, such as taught in Hamakawa, the film 22 is typically formed of a highly conductive metal such as aluminum. However, according to the present invention, film 22 is a highly doped microcrystalline silicon film. We have found that a highly doped microcrystalline silicon film having a thickness of from about 500 to about 5000 angstroms and preferably from about 2000 to 4000 angstroms provides sufficient conductivity for low light level, for example less than 200 lux, applications and that the usual metallic conducting layer can be eliminated. As explained in the examples below, elimination of the usual metallic current collecting film results in a dramatic improvement in production yield.

Figure 2:
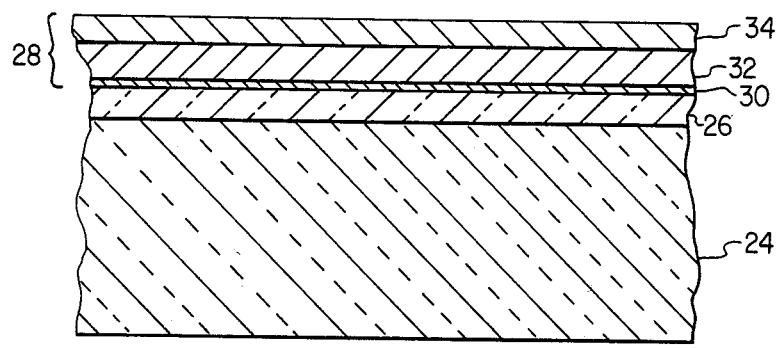
FIG. 2 is a cross-sectional illustration, not to scale, of a second embodiment of the present invention.

With reference now to FIG. 2 there is illustrated a second embodiment of the present invention. The device of FIG. 2 is fabricated on a glass substrate 24, again using basically the techniques of Hamakawa. A transparent conductive film 26 is first deposited on the substrate 24. A thin silicon film 28 having a somewhat modified p-i-n structure is then deposited on the front-face current collecting layer 26. Film 28 includes a p-doped region 30 in contact with the film 26 and an intrinsic region 32. Both regions 30 and 32 are formed of amorphous silicon. If desired, region 30 may include carbon as taught by Hamakawa. The silicon film 28 also includes a microcrystalline n-doped region 34. Region 34 is preferably highly doped and is relatively thick having dimensions in the ranges suggested for film 22 of FIG. 1. In the FIG. 2 embodiment the region 34 forms both the n-type region of the p-i-n silicon diode structure and simultaneously acts as the only back-face current collecting film for the photovoltaic device. That is, no metallic or other form of electrical conductor is deposited upon the thin film silicon device 28.

The elimination of the usual back-face conductor from the photovoltaic device of the present invention results in a marked improvement in yield primarily because pinhole problems are avoided. Pinholes are generally caused by the presence of dust particles on a substrate onto which a thin film is being deposited. As the film is deposited, the dust particles mask the substrate and prevent formation of the film at the location of the dust particle. In later processing, the dust particles are removed leaving behind an uncoated or exposed substrate area. In manufacture of thin film silicon photovoltaic devices, the silicon film, for example film 14 of FIG. 1, is deposited on a substrate coated with a transparent conductor 12. All the layers of silicon film 14, and, in the case of FIG. 1, film 22 can be deposited in a single glow discharge chamber without removal of the substrates. Any dust particles which are present will therefore form pinholes through all of the silicon layers which are deposited in sequence. In the prior art devices, the substrates with silicon films were then moved to a different chamber for application of a back contact such a aluminum. It was during this step of the process that dust particles were dislodged exposing the front-face contact through the resulting pinholes. When the back-face contact was deposited, it therefore could make direct contact to the front-face contact in the pinhole areas. However, in a device according to the present invention the metallic back contact is eliminated so such shunting through pinholes is avoided. In addition, the separate processing step, and corresponding expense, is avoided. In the FIG. 2 embodiment, the separate amorphous silicon n-type layer 20 is also eliminated, again simplifying the process and reducing the time and corresponding expense.

As taught by the Tanner patent, microcrystalline silicon, properly doped, can be produced with an electrical conductivity as high as twenty inverse ohm centimeters. When a film of such material of at least 1000 angstroms thickness is used in the present invention, there is sufficient conductivity for the film to act as a current collecting layer of a low-level device so that the normal metallic film is not needed.

A number of test structures according to FIG. 2 were fabricated to test the present invention. Control test samples were also fabricated and tested. The control samples had a structure like that of FIG. 1 except that the film 22 was formed of aluminum. In the test structures, according to FIG. 2, the microcrystalline layer 34 had a thickness of about 3000 angstroms. In order to reduce the time of depositing such a thick silicon film 34, an RF power level of 100 watts was applied to electrodes having dimensions of fourteen inches by fifteen inches and a chamber pressure of two torr was employed. The deposition gas was a mixture of silane, hydrogen and 0.3 percent by volume phosphine in helium in the relative volumetric proportions of 1:64:0.533. The resulting photovoltaic cells were tested at a light level of 200 lux, selected as a typical indoor low light level. About ninety percent of test structures, according to FIG. 2, each having an area of about four square centimeters were found to have an efficiency exceeding five percent. Only about seventy percent of the control devices were found to have an efficiency exceeding five percent. Thus, by eliminating pinhole shunts the structures of the present invention provide a significant yield improvement and therefore appear to be commercially viable.

As illustrated by these example devices a microcrystalline silicon current collecting film thickness of 3000 angstroms is suitable for a 200 lux light level. For higher light levels, the film thickness should be proportionally increased. Thus, a 6000 angstrom thick film should be suitable for a 400 lux light level. The increased film thickness improves conductivity to reduce voltage losses at the higher current levels. However, the processing time, and expense, also increases as film thickness is increased and places a practical upper limit on film thickness.

While in the present invention a microcrystalline film has been used to replace both an n-type region of a silicon film and its corresponding current collecting film, it is apparent that a microcrystalline film can also be used to replace a p-type silicon region and its corresponding current collecting film. Microcrystalline silicon is particularly suited to this purpose for several reasons. Microcrystalline silicon is more efficiently doped, that is exhibits a higher conductivity for a given doping concentration than does amorphous silicon. Such a highly doped layer is also more transparent to incoming light and therefore serves well as as window layer. Therefore, heavy doping of a microcrystalline p-layer not only improves its conductivity sufficiently to act as a current collecting layer, but also makes the material a better window layer.

In addition to those discussed above, there are other advantages of the present invention. The typical aluminum back contact is soft as compared to silicon. Devices according to the present invention are therefore much more rugged and have far less chance of being damaged by being scratched during the manufacturing process. There also has been evidence that the ohmic contact between aluminum and silicon can degrade with time, especially if any water vapor is present. This problem is also avoided by the present invention.

While the present invention has been illustrated and described with reference to particular structures and methods of manufacture, various changes or modifications may be made therein within the scope of the present invention as defined by the appended claims.

What is claimed is:

1. In a photovoltaic cell of the type having a first current collecting film, an amorphous silicon film having a p-i-n structure and having the p-region in contact with the first current collecting film, and a second current collecting film in contact with the n-region of said amorphous silicon film, the improvement comprising use of a doped microcrystalline silicon film having a thickness greater than 500 angstroms in place of at least one of said p-region and said first current collecting film or said n-region and said second current collecting film.

2. A photovoltaic device comprising,
   a transparent front-face electrode,
   a thin film photovoltaic amorphous silicon layer on said front face electrode,
   a back-face electrode consisting of a layer of microcrystalline silicon having a thickness greater than 500 angstroms directly contacting said amorphous silicon layer.

3. A photovoltaic device according to claim 2 wherein said microcrystalline layer is highly doped.

4. A photovoltaic device according to claim 2 wherein said back-face electrode is a least 1000 angstroms thick.

5. A photovoltaic device according to claim 2 wherein said amorphous silicon layer comprises a p-doped region in direct contact with said front face electrode and an intrinsic region in direct contact with said back-face electrode and wherein said microcrystalline layer is n-doped.

6. A photovoltaic device according to claim 2 wherein said amorphous silicon layer comprises a p-doped region in direct contact with said front fact electrode, an intrinsic region, and an n-doped region in direct contact with said back-face electrode and wherein said microcrystalline layer is n-doped.

7. In a process for manufacturing a photovoltaic device of the type wherein a thin film silicon photovoltaic structure is deposited by glow discharge in silane onto a transparent conductive substrate, said substrate forming a front-face current collecting film, and a back-face current collecting film is deposited onto said thin film silicon structure, the improvement comprising;

depositing said back-face current collecting film in the form of microcrystalline silicon having a thickness greater than 500 angstroms by glow discharge in silane without removing said substrate from the glow discharge chamber after deposition of said thin film silicon photovoltaic structure.

* * * * *